United States Patent
Laukkanen et al.

(10) Patent No.: US 9,269,763 B2
(45) Date of Patent: Feb. 23, 2016

(54) METHOD FOR TREATING A SUBSTRATE AND A SUBSTRATE

(75) Inventors: Pekka Laukkanen, Turku (FI); Jouko Lang, Lieto (FI); Marko Punkkinen, Turku (FI); Marjukka Tuominen, Turku (FI); Veikko Tuominen, Turku (FI); Johnny Dahl, Turku (FI); Juhani Vayrynen, Kaarina (FI)

(73) Assignee: Turun Yliopisto, Turun Yliopisto (FI)

( * ) Notice: Subject to any disclaimer, the term of this patent is extended or adjusted under 35 U.S.C. 154(b) by 42 days.

(21) Appl. No.: 13/881,420

(22) PCT Filed: Nov. 8, 2011

(86) PCT No.: PCT/FI2011/050991
§ 371 (c)(1),
(2), (4) Date: Apr. 25, 2013

(87) PCT Pub. No.: WO2012/062966
PCT Pub. Date: May 18, 2012

(65) Prior Publication Data
US 2013/0214331 A1    Aug. 22, 2013

(30) Foreign Application Priority Data
Nov. 11, 2010 (FI) .................................. 20106181 U

(51) Int. Cl.
*H01L 21/02* (2006.01)
*H01L 29/02* (2006.01)
(Continued)

(52) U.S. Cl.
CPC .......... *H01L 29/02* (2013.01); *H01L 21/02109* (2013.01); *H01L 21/02241* (2013.01);
(Continued)

(58) Field of Classification Search
CPC .............. H01L 29/2003; H01L 29/517; H01L 21/0254; H01L 21/28194; H01L 28/55; H01L 28/40
USPC ..................... 257/200, 410; 438/240
See application file for complete search history.

(56) References Cited

U.S. PATENT DOCUMENTS 4,226,667 A * 10/1980 Logan ........................... 438/703
5,214,003 A    5/1993 Shimakura et al. ........... 437/243
(Continued)

FOREIGN PATENT DOCUMENTS

EP    0 426 877    5/1991
JP    5-226371    9/1993
(Continued)

OTHER PUBLICATIONS

Batzill et al, Surface oxygen chemistry of a gas-sensing material: SnO2(101), Europhys. Lett., 65 (1), pp. 61-67 (2004).*
(Continued)

*Primary Examiner* — Lex Malsawma
*Assistant Examiner* — Eric Jones
(74) *Attorney, Agent, or Firm* — James C. Lydon

(57) ABSTRACT

A method for treating a compound semiconductor substrate, in which method in vacuum conditions a surface of an In-containing III-As, III-Sb or III-P substrate is cleaned from amorphous native oxides and after that the cleaned substrate is heated to a temperature of about 250-550° C. and oxidized by introducing oxygen gas onto the surface of the substrate. The invention relates also to a compound semiconductor substrate, and the use of the substrate in a structure of a transistor such as MOSFET.

12 Claims, 4 Drawing Sheets

(51) Int. Cl.
  *H01L 21/28* (2006.01)
  *H01L 21/316* (2006.01)
  *H01L 29/10* (2006.01)
  *H01L 29/20* (2006.01)
  *H01L 29/205* (2006.01)

(52) U.S. Cl.
  CPC .... *H01L21/28264* (2013.01); *H01L 21/31666* (2013.01); *H01L 29/1054* (2013.01); *H01L 29/20* (2013.01); *H01L 29/205* (2013.01)

(56) References Cited

U.S. PATENT DOCUMENTS

| | | | | |
|---|---|---|---|---|
| 5,700,703 | A | | 12/1997 | Huang et al. ............... 437/40 |
| 5,821,171 | A | * | 10/1998 | Hong et al. ............... 438/767 |
| 5,880,029 | A | * | 3/1999 | Eisenbeiser et al. ......... 438/694 |
| 5,907,169 | A | | 5/1999 | Hshieh et al. ............. 257/262 |
| 6,531,414 | B1 | | 3/2003 | Johnson et al. ............ 438/785 |
| 2005/0186117 | A1 | * | 8/2005 | Uchiyama et al. ........... 422/91 |
| 2005/0255984 | A1 | * | 11/2005 | Ota et al. ............ C03C 3/085 501/4 |
| 2009/0085073 | A1 | * | 4/2009 | Droopad et al. ............ 257/288 |
| 2009/0266411 | A1 | * | 10/2009 | Habib et al. .............. 136/255 |

FOREIGN PATENT DOCUMENTS

| | | |
|---|---|---|
| JP | 6-104189 | 4/1994 |
| JP | 9-162201 | 6/1997 |
| JP | 2004-288716 | 10/2004 |
| WO | WO 90/15436 | 12/1990 |

OTHER PUBLICATIONS

Chen et al., "Structure-sensitive Oxidation of the Indium Phosphide (001) Surface," 91 J. Applied Physics 9362 (2002).

Punkkinen et al., "Core-level shifts of InP (100)(2x4) Surface: Theory and Experiment," 603 Surface Sci. 2664 (2009).

Kozhukhov et al., "Influence of Al Adsorption on In and Ga Thermal Desorption from InP and GaAs Surfaces Heated Under $As_4$ Flux," 306 Thin Solid Films 248 (1997).

Bouslama et al., "Effects of the Electron Beam on InP(100)," 47 Vacuum 27 (1996).

Arciprete et al., "Optical Anistropy of Oxidized InAs(001) Surfaces," 515 Surface Sci. 281.

Hyunhyub et al., "Ultrathin Compound Semiconductor on Insulator Layers for High-performance Nanoscale Transistors," 468 Nature 286 (2010).

Decision to Grant A Patent in counterpart Russian Appln. 2013-126686/28 (039586) (Mailed Oct. 7, 2015) with English Translation.

* cited by examiner

InAs(100)c(8x2) substrate with one oxygen atom

InAs(100)-(3x1)-O

InAs(100)-c(4x2)-O

METHOD FOR TREATING A SUBSTRATE AND A SUBSTRATE

FIELD OF THE INVENTION

The present invention relates to a method for treating a compound semiconductor substrate in order to produce a crystalline oxide layer on the substrate. The invention also relates to a compound semiconductor substrate, and the use of the substrate in a structure of a transistor such as a MOSFET, or in a structure of an optoelectronic device.

BACKGROUND OF THE INVENTION

The understanding and development of the oxidized semiconductor surfaces and oxide-semiconductor interfaces are relevant to many technologies such as passivation of surface defects of outermost device parts and processing of electronics materials as well as manufacturing of insulator-semiconductor interfaces for the metal-oxide-semiconductor-field-effect-transistors (MOSFETs). Perhaps every semiconductor device includes an insulator-semiconductor interface, MOSFET is a good example. Current MOSFETs, used for example in microprocessors, are predominantly based on the Si channel and silicon dioxide ($SiO_2$) and hafnium dioxide ($HfO_2$) gate insulators. These devices are facing their fundamental limits as more powerful components are developed. III-V compound semiconductors such as InAs, InGaAs, InSb and InP are desired channel materials for future MOSFETs, due to superior mobilities of electrons in these materials in comparison to silicon (Si). Therefore, significant efforts have been initiated to produce gate insulator interfaces of III-V channel layers, which are stable and meet commercial device criteria, as the $SiO_2$—Si junction successfully does. However, this great goal, which would lead, for example, to the increased lifetime of devices and energy savings at servers, has not been yet achieved.

One of the main reasons for this is the presence (or formation) of native amorphous III-V surface oxides, which cause Fermi-level pinning via high density of defect states at the semiconductor-insulator interface. So, these native amorphous oxides are detrimental to the transistors. Therefore, a huge amount of work has been done to find the method to passivate III-V surfaces against the reaction with oxygen and formation of amorphous oxides. This is however a very challenging task since it is difficult to avoid the reaction between III-V semiconductor surface and oxygen during the growth of interfaces. For example, during the insulator layer growth, the III-V surfaces usually react with oxygen. So, it is still not known whether avoiding the oxygen reaction during interface growth is possible. However, it is well known that processing of the starting III-V surfaces significantly affects the properties of MOSFETs, and crystalline (or epitaxial) oxide interfaces are highly desired for these devices.

Recently [1], an interesting improvement has been found in the InAs-channel MOSFET of which InAs surface was thermally oxidized in a furnace with an atmospheric pressure conditions. The transmission-electron-microscopy image from this interface shows the formation of crystalline islands of $InAsO_x$. However, the surface of the resulting layer including $InAsO_x$ is not long-range ordered and becomes contaminated in the atmospheric preparation conditions used.

In previous vacuum-based experiments [e.g., Ref. 2], it has been found that different surface structures on the starting III-V substrate affect the oxidation and the properties of the resulting III-V surface oxides. The presented III-V surface oxides are amorphous without long-range order. Therefore, any oxidation of III-V surfaces has been commonly considered to be harmful and tried to be avoided.

To recapitulate, the unsolved problem relating to the use of the III-V compound semiconductors in MOSFETs is an amorphous semiconductor-oxide interface (or the lack of enough crystalline oxide-semiconductor interface), which causes harmful effects such as Fermi-level pinning, a detrimental leakage currents, and decrease in the carrier mobilities in the MOSFETs.

SUMMARY OF THE INVENTION

It is an object of the present invention to provide a novel method for treating III-V compound semiconductor substrate in such a way that the above mentioned problems can be avoided.

It is especially an object of the present invention to provide a method for forming a stable and crystalline oxide layer on the III-V compound semiconductor substrate, especially on the Indium (In)-containing III-Arsenic (As), III-Antimony (Sb) or III-phosphorus (P) substrate.

It is especially an object of the present invention to provide a method for producing stable and crystalline oxygen-induced III-V semiconductor surfaces, which method would also be very helpful for producing the crystalline MOSFET interfaces.

It is also an object of the invention to present a simple process for forming a crystalline long-range ordered oxide layer on the compound semiconductor substrate.

In order to achieve the objects mentioned above, the method and the compound semiconductor substrate according to the present invention are characterized in what is defined in the characterizing part of the enclosed independent claims.

Some preferred embodiments according to the invention are disclosed in the dependent claims presented further below.

Further, the invention relates to the use of the III-V compound semiconductor substrate according to the invention in a structure of a transistor, such as in a structure of a MOSFET. The invention also relates use of the III-V compound semiconductor substrate according to the invention in a structure of an optoelectronic device such as a light emitting diode, photodiode, photocapacitor, photovoltaic cell or semiconductor based laser.

In the method according to the invention for producing a crystalline oxide layer on an In-containing III-As, III-Sb or III-P compound semiconductor substrate, in vacuum conditions

- a surface of an In-containing III-As, III-Sb or III-P substrate is cleaned from amorphous native oxides, and after that
- the cleaned substrate is heated to a temperature of about 250-550° C. and oxidized by introducing oxygen gas onto the surface of the substrate.

Typically, a compound semiconductor substrate according to the present invention comprises at least
- an In-containing III-As, III-Sb or III-P base material having a first side and a second side, and
- a crystalline (3×1)-O, (2×3)-O, c(4×2)-O, (1×2)-O, (3×1)-SnO, (3×3)-SnO, or (1×1)-SnO oxide layer being formed on at least a part of the first side of the base material.

Preferably, the crystalline oxide layer is formed on the base material of the compound semiconductor substrate by the method according to the invention.

Surprisingly, it has now been found that the Indium (In)-containing III-Arsenic (As), III-Antimony (Sb) or III-phosphorus (P) substrate can be oxidized in a controlled way in vacuum conditions in order to produce a stable and crystalline oxide layer on the surface of the substrate, which oxide layer does not further react with oxygen. In other words, the present invention is based on the fact that no attempt is made to avoid the reactions between said III-V material and oxygen as has been done in the prior art, but the oxidation is carried out in a controlled way in order to produce desired crystal structure on the surface of the compound semiconductor substrate. The preparation of surface oxides according to the invention requires the vacuum conditions. Therefore, the method presented in Ref. [1] does not provide the crystalline oxide layers, found here, with the long-range ordered surfaces.

Long-range ordered oxide surface means here a uniform layer which has a well-defined structure over the whole sample surface, providing a clear LEED pattern.

Especially, a family of novel ordered oxide layers on InAs (Indium arsenide), InGaAs (Indium gallium arsenide), InSb (Indium antimonide), InGaSb (Indium gallium antimonide) and InP (Indium phosphide) surfaces has now been found. The ordered oxide layer has a crystalline (3×1) structure on the surface of the In-containing III-As and III-Sb surface, and a crystalline (2×3) structure on the InP surface. In addition to those, an oxide structure of c(4×2) forms on the In-containing III-As surface, and a (1×2)-O structure on the In-containing III-Sb. The oxide layers have been identified by using low-energy-electron-diffraction (LEED), scanning-tunneling-microscopy/spectroscopy (STM/STS), as well as core-level and valence-band photoemission measurements.

In the method for forming a crystalline oxygen-induced In-containing III-As, III-Sb or III-P semiconductor surface, the formation of the initial surfaces is crucial. In the method according to the invention, the desired starting surfaces are formed by cleaning the semiconductor surfaces in vacuum conditions in such a way that the poor (amorphous) native surface oxides and the carbon contamination can be removed from the surface of the substrates. The starting InAs and InSb surfaces formed by the cleaning have the c(8×2) reconstruction and the starting InP surface has the (2×4) reconstruction.

During the oxidation method according to the invention, the crystalline oxide layers described above can be formed on the In-containing III-As, III-Sb or III-P substrate. In the method, the temperature of the cleaned substrate is raised to a certain level and the oxidation of the substrate is carried out in a controlled manner in vacuum conditions by introducing the oxygen gas onto the surface of the substrate. The formation of the crystal oxide layer on the surface of the substrate is dependent on the initial surface of the substrate, the temperature and the oxygen gas pressure during the oxidation, and the oxidation time.

The pressure of the vacuum chamber, in which the method according to the invention is carried out, is lower than atmospheric pressure i.e. the method according to the invention is carried out in vacuum conditions. Typically, the base pressures of the vacuum chamber in the method according to the invention are lower than $5 \times 10^{-8}$ mbar. The lower level of the pressures of the vacuum chamber is dependent on the equipment used.

The substrate temperature during oxidation is kept at about 250-550° C. in order to produce the crystalline oxide layers onto the surface of the substrate. Specifically, a substrate temperature of about 340-400° C. during the oxidation produced an InAs(100)(3×1)-O layer and a temperature of about 340-450° C. produced an InSb(100)(3×1)-O layer. The substrate temperature will be about 450-500° C. for forming the crystalline (2×3)-O layer on the InP substrate. In the case of InGaAs and InGaSb the temperature range is about 400-550° C. However, it has to be noted that the above-mentioned temperature ranges are dependent on the oxygen gas pressure and it may be possible to produce the crystalline oxide layers also in temperatures close to the defined ranges, if the oxygen gas pressure is varied. The limit of inaccuracy of the thermometry was ±25° C.

The oxygen gas pressure is preferably between $5 \times 10^{-7}$ and $5 \times 10^{-5}$ mbar during the oxidation, and the substrate is oxidized preferably for about 15-45 minutes and more preferably for about 15-30 minutes for producing the crystalline oxide layers on the surface of the substrate. The heating and the oxidation of the substrate can be carried out simultaneously or the substrate can be heated at the desired temperature before starting the oxidation process. Normally, the heating and oxygen exposure were shut down simultaneously after the oxygen exposures.

The formed oxide layers are crystalline and stable. The thickness of the oxide layer is typically 0.2-1 nm and more typically 0.2-0.5 nm.

In one embodiment according to the invention, the cleaned III-V surface is covered by the tin (Sn) layer, of which thickness is 0.5-2 atomic layer (monolayer). The heating of the Sn-covered surface at 300-550° C. produces the (1×2) Sn-induced structure. The oxidation of these surfaces, as described above, produces the crystalline oxide-layer including tin. Such SnO-containing layers have the same thickness as the (3×1)-O has, and owns the following structures (long-range ordered): (3×1) and (3×3) on the InAs substrate, (3×1) on the GaAs substrate, and (1×1) on the InP substrate.

The crystalline oxide layer formed in the method according to the invention will function as a passivating layer, which protects the semiconductor substrate in the formation of natural amorphous oxides. In addition, the resulting oxide layers have no states at the Fermi-level. Therefore, the substrate according to the invention makes possible the development of more powerful components, for example MOSFETs. Especially, the method and substrate according to the invention can be used in the field of transistors. The invention makes possible the use of In-containing III-As, III-Sb or III-P materials as channel materials for future complementary MOS devices.

The crystalline oxide layers according to the invention can also be applied as a barrier layer with a large energy band gap in devices like laser diodes and LEDs, and as a part of the passivation of the outermost device surfaces. The substrate according to the invention can be used in a structure of an optoelectronic device such as a light emitting diode, photodiode, photocapacitor, photovoltaic cell or semiconductor based laser.

Alternatively, the In-containing III-As, III-Sb or III-P substrate according to the invention can be a layer, which has been applied on durable and inexpensive Si substrates. This can be done for example with various crystal growth methods. The ultimate goal is that carriers (electrons and holes) move fast in the III-channel layers produced on Si substrates.

DESCRIPTION OF THE DRAWINGS

In the following, the invention will be described in more detail with reference to the appended drawings, in which.

DETAILED DESCRIPTION OF THE INVENTION

Figure 1:
FIG. 1 shows a simplified representation of a cross section of a compound semiconductor substrate according to the invention.

FIG. 1 shows a simplified representation of a cross section of a compound semiconductor substrate according to the invention. The substrate comprises In-containing III-As, III-Sb or III-P base material 1 having a first side and a second side, and a crystalline oxide layer 2 being formed on at least a part of the first side of the base material. The base material can be an In-containing III-As, III-Sb or III-P substrate or it can be an In-containing III-As, III-Sb or III-P layer on the surface of a substrate made of some other material, for example silicon (Si). The crystalline oxide layer has a structure of (3×1)-O, (2×3)-O, c(4×2)-O, (1×2)-O, (3×1)-SnO, (3×3)-SnO, or (1×1)-SnO depending on the base material.

Preferably, the crystalline oxide layer 2 is formed on the whole surface of the first side of the base material. The oxide layer can comprise some crystal defects i.e. amorphous regions or other crystalline structures, but preferably at least 90% of the layer comprises said crystalline structure. The valence-band and core-level photoemission results indicate that possible defect concentration is smaller than $5 \times 10^{11}$ defects per cm$^2$.

In the method for forming a crystalline oxygen-induced In-containing III-As, III-Sb or III-P semiconductor surface, the surfaces of the base material are first cleaned from the amorphous native surface oxides and the carbon combination. The cleaning can be carried out by argon ion sputtering and post heating in an ultrahigh vacuum (UHV) chamber. The argon ion sputtering and post heating in UHV conditions at least to 400° C. leads to well-defined c(8×2) reconstructions on the starting InAs and InSb surfaces and a (2×4) structure on the InP substrate. These starting surfaces can be obtained also by pure heating in UHV at around 400-550° C. or more to remove a protective As-cap layer produced by an epitaxial growth method. In the vacuum conditions, preferably the chamber base pressures lower than $5 \times 10^{-8}$ mbar were used.

Before oxidations, the clean starting surfaces showed (i) sharp c(8×2) or (2×4) low-energy-electron-diffraction (LEED) patterns, (ii) large smooth areas with terraces usually in the order of 100 nm in diameter size as deduced by scanning tunneling microscopy (STM), and (iii) no oxygen and carbon contamination as deduced by x-ray photoelectron spectroscopy (XPS).

Figure 3A:
FIGS. 3a, 3b and 3c show (a) an atomic model for the c(8×2) structure of the starting InAs surface, (b) an atomic model for the (3×1)-O layer on InAs, and (c) an atomic model for the c(4×2)-O layer on InAs. The O, In, and As atoms are shown with black, white, and gray spheres, respectively.

In the oxidation process, oxygen is adsorbed on the c(8×2) or (2×4) surface. FIG. 3a shows the InAs surface with an oxygen atom in the energetically most favourable atom position. The stability of this adsorption position, which is located in the second surface layer, i.e. below the surface, is very significant. It is so stable (~1 eV more stable than the other adsorption positions) because the relatively electronegative oxygen is bound to four relatively electropositive Indium atoms. It is important to note that this kind of adsorption site is found because the peculiar c(8×2) structure includes a mixed (III-V) first surface layer.

A better understanding of the present invention such as oxidation conditions may be obtained through the following examples which are set forth to illustrate, but are not to be construed to limit of the present invention.

The following examples have been carried out using a surface-science system (Omicron) which includes three different vacuum chambers connected via gate valves, so that the samples can be transferred between chambers without breaking the vacuum conditions. The samples were put into the vacuum through the loading chamber. The oxidations were performed in the preparation chamber, and oxidized surfaces were characterized in the analysis chamber. The same surface cleaning and oxide preparations were done also in a separate vacuum system at the MAX-lab using the beamline 41 at the synchrotron ring MAX-I.

Oxidation experiments were performed in a vacuum chamber using molecular oxygen gas with a leak valve via which $O_2$ gas was injected into the chamber. The $O_2$ pressure was controlled to be between about $5 \times 10^{-7}$ and $5 \times 10^{-5}$ mbar during oxidation experiments. The sample surface was faced toward the leak valve at a distance of about 15 cm. The oxidation time of the substrates heated simultaneously was about 15-30 minutes. The heating and oxygen exposures were shut down simultaneously after the oxygen exposures. The substrate temperature during the above mentioned oxidation conditions affected the formed crystal structure of the oxidized semiconductor, preferably as follows:

The temperature about 340-400° C. produced an InAs (100)(3×1)-O layer

The temperature about 400-450° C. produced an InAs (100)c(4×2)-O layer

The temperature about 340-450° C. produced an InSb(100) (3×1)-O layer

The temperature about 340-450° C. produced an InSb(100) (1×2)-O layer

The temperature about 450-550° C. produced an InGaAs (100)c(4×2)-O layer, which clearly indicates that InGaAs(100)(3×1)-O layer is formed below 550° C. if the amount of Indium is high enough in the surface layer. The calculations predict the formation of InGaAs(100)(3×1)-O when the Indium amount increases in a surface layer of InGaAs. The temperature range in the case of InGaSb is similar as InGaAs.

For the oxide layers including tin (Sn), the substrate temperature during the above mentioned oxidation conditions affected the formed crystal structure of the oxidized semiconductor, preferably as follows:

The temperature about 370-400° C. produced an InAs (100)(3×1)-SnO layer

The temperature about 400-450° C. produced an InAs (100)(3×3)-SnO layer

The temperature about 370-450° C. produced an InP(100) (1×1)-SnO layer

The temperature about 450-550° C. produced an GaAs (100)(3×1)-SnO layer.

The examples of the oxidation process of the InAs and InSb substrates are shown on the following Tables 1 and 2. The substrates are heated to the desired temperature before starting the oxidation. The formed crystalline structure of the (3×1)-O layer was detected by the low-energy-electron-diffraction (LEED) measurement. Table 1 presents the oxidation of InAs substrate with the different oxidation times. The oxygen gas pressure was $4 \times 10^{-6}$ mbar during oxidation.

TABLE 1

| Oxidation | T (° C.) | t (min) | LEED |
|---|---|---|---|
| I | 374 | 5 | c(4x2) |
| II | 376 | 15 | (3x1) + weak c(4x2) |
| III | 375 | 20 | (3x1) + weak c(4x2) |
| IV | 374 | 30 | (3x1) |
| V | 373 | 45 | weaker (3x1) |

Table 2 presents the oxidation of InSb substrate with the different oxidation times, the oxygen gas pressure was 3-4×$10^{-6}$ mbar.

TABLE 2

| Oxidation | T (° C.) | t (min) | LEED |
|---|---|---|---|
| I | 350 | 5 | (1x2) with splitted x2 spots |
| II | 349 | 10 | (1x2) with splitted x2 spots |
| III | 353 | 15 | (3x1) + weak (1x2) with splitted x2 spots |
| IV | 351 | 20 | (3x1) |
| V | 351 | 30 | (3x1) |

There is also an alternative embodiment to produce a (3×1)-O layer on the In-containing III-As or III-Sb substrate. Namely, the InAs(100)c(4×2)-O layer was prepared first on the substrate by using a temperature of 400-450° C., and then the substrate was taken out from the vacuum chamber into air where it was kept about 30 min. After that the sample was transferred back into the vacuum conditions and heated to about 400-450° C. for 20 min. That also led to the formation of (3×1)-O. This shows that the starting InAs(100)c(4×2)-O layer can "catalyze" the formation of (3×1)-O since the same air-exposure of clean InAs surface does not produce the (3×1)-O. In FIG. 3c is shown an atomic model for c(4×2)-O layer on InAs structure.

Figure 2:
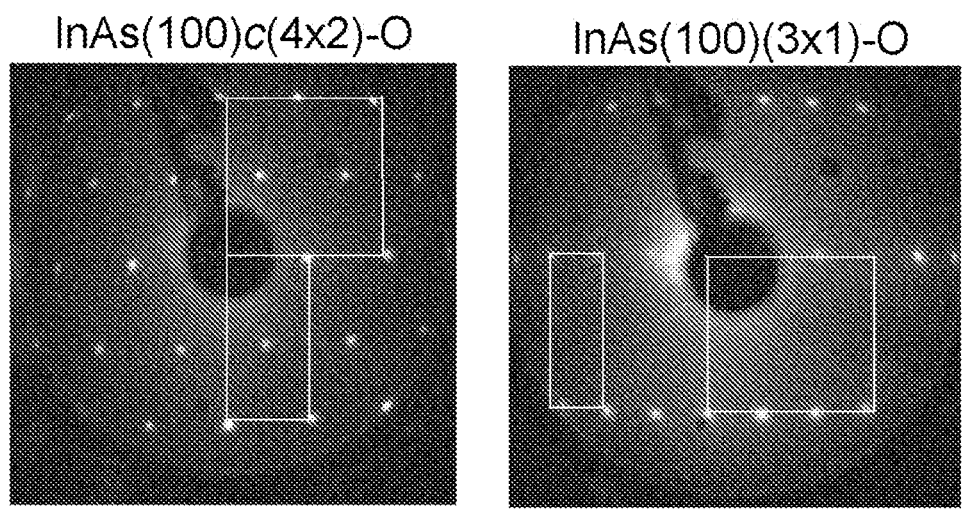
FIG. 2 shows LEED patterns from the InAs(100)c(4×2)-O and InAs(100)(3×1)-O layers. The white squares show the (1×1) unit cells of the InAs substrate and the white rectangles show the unit cells of the c(4×2)-O and (3×1)-O layers.

FIG. 2 shows the LEED intensity patterns from the c(4×2)-O and (3×1)-O layers on the InAs substrate. It is worth noting that the pattern from the InSb(100)(3×1)-O layer was similar to that in FIG. 2. First of all, the sharp intensity spots with low background intensity reveal that both oxide layers are well-ordered or crystalline. Second, the additional intensity spots inside the 1×1 unit cell, which is shown with a white square in FIG. 2, reveal that the oxide layer includes (3×1) crystal lattice, which is shown with the white rectangle.

Figure 3B:
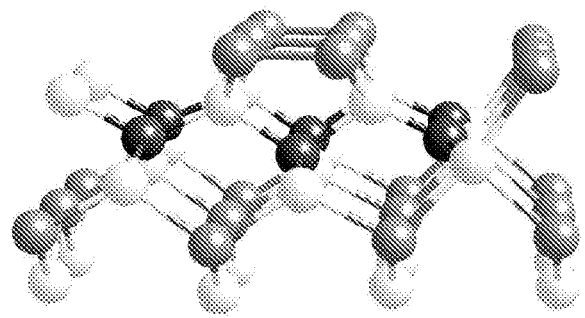
Figure 3C:
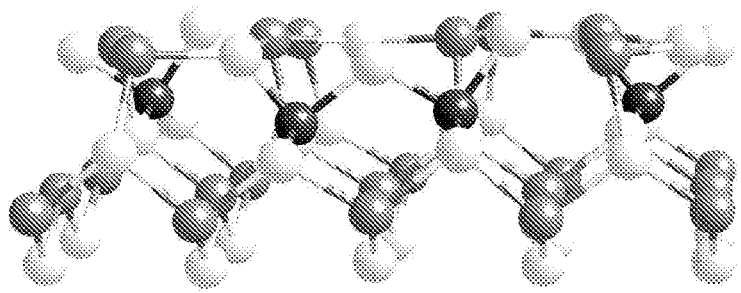

By comparing the different measurements with ab initio calculations, a preliminary atomic model for the crystal structure of (3×1)-O layers is proposed in FIG. 3b.

Figure 4:
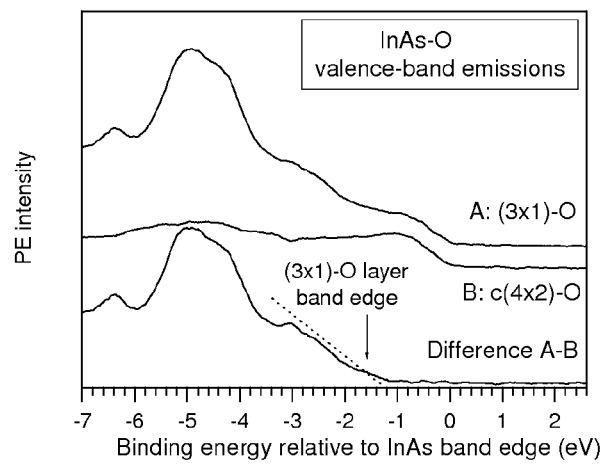
FIG. 4 shows valence-band photoemissions from the InAs (100)(3×1)-O and c(4×2)-O layers.

FIG. 4 shows valence-band photoemissions from the InAs (100)(3×1)-O and c(4×2)-O layers. The measurements show that these interfaces do not include metallic electronic states around the Fermi energy. Moreover, it is important to note that the band bending, which is more sensitive to defects, did not occur as compared to the clean InAs(100)c(8×2), supporting the absence of pinning. These results indicate that the harmful Fermi-level pinning can be avoided in MOSFETs. Also scanning tunneling spectroscopy (STS) measurements show that these crystalline oxide layers do not cause harmful electronic states in the band-gap of InAs. The valence band maximum difference (or offset) between the InAs substrate and the (3×1)-O layer is estimated in FIG. 4 using a difference spectrum between the InAs(100)(3×1)-O and InAs(100)c(4×2)-O spectra, in which the InAs band edge is basically removed. This difference spectrum gives an estimation for the (3×1) valence band edge: it has a 1.0-1.4 eV higher binding energy than the InAs one, which might be high enough to provide an energy barrier for electric carriers in the valence band of MOSFETs. For the reference, the Fermi-level emission was measured from an air-exposed InAs(100)c(8×2) surface, which was oxidized and showed a poor (1×1) LEED. That spectrum showed an emission at the Fermi-level, as expected to arise from defect states of such an amorphous surface.

Figure 5:
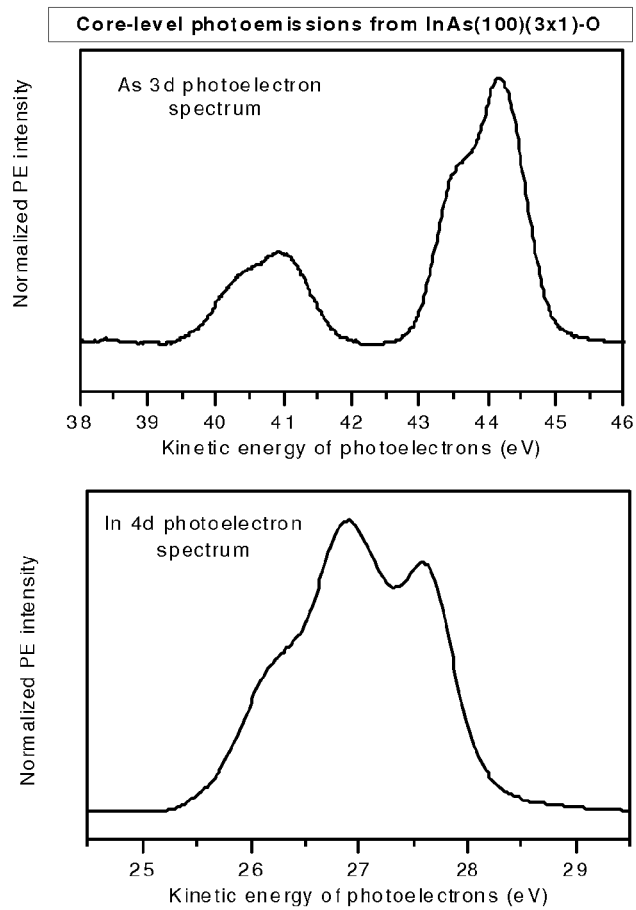
FIG. 5 shows core-level photoemission spectra for In 4d and As 3d lines.

FIG. 5 shows core-level photoelectron spectra for the In 4d and As 3d lines. The features (peaks or shoulders) at the low kinetic energy side demonstrate the presence of oxygen and the formation of the oxide layer.

The interface stability that is an important property for the applications was tested as follows. The passivity of the InAs (100)(3×1)-O and InAs(100)c(4×2)-O surfaces were tested by taking the samples into the atmosphere for 0.5-1 hours. After that they were transferred back into the vacuum chamber and characterized by LEED and STM as a function of the post heating time. After one hour air exposure, the InAs(100) (3×1)-O sample produced, without any post heating, a (3×1) pattern. Naturally, the obtained pattern was weaker than the (3×1) pattern before air exposure, but the pattern became clear (3×1) by heating the substrate to 400° C. for 30 min. These LEED findings are supported by the STM from the InAs(100)(3×1)-O surface after 0.5-hour air exposure and post heating at 400° C. One should note that the same air exposure and post heating procedure of the clean InAs(100) c(8×2) surface led to a poor (1×1) LEED without any clear superstructure. These results indeed show that the InAs(100) (3×1)-O layer is stable against rather strong air and temperature loadings. This is an important property, which allows for example the transfer of the (3×1)-O sample via air into another chamber to grow for example a $SiO_2$ top insulator layer. The stability also indicates that the (3×1)-O layer does not break during the deposition of a top insulator layer. It is worth noting that the atomic layer deposition (ALD) of the gate insulators on InAs(100) and InGaAs(100) is usually performed at substrate temperatures of 250-350° C., at which the InAs(100) (3×1)-O was clearly stable. The same passivation tests for the InAs(100)c(4×2)-O showed a poor (1×1) after air exposure, but after post heating to about 400° C., a (3×1) LEED appeared. This indicates that the c(4×2)-O structure might "catalyze" the formation of the (3×1) layer since we did not observe the same formation after the air exposure of the clean InAs(100)c(8×2) surface.

The following example describes the oxidation process according to the invention by using the InGaAs substrate.

The surface of the GaAs(100) substrate wafer (about 0.5 mm thick) was cleaned from the carbon contamination and amorphous surface oxides with Ar-ion sputtering and heating in an ultrahigh vacuum (UHV) chamber. During the 30 min raster sputtering, the Ar-gas pressure was 1-3×$10^{-6}$ mbar, the sputtering voltage was 0.7 kV and the current 10 mA, and the GaAs substrate temperature was about 400° C. After this sputtering, the GaAs substrate was heated to about 570° C. in a vacuum smaller than 1×$10^{-9}$ mbar for 30 min. Six such sputtering-postheating cycles produced a clean and smooth surface, which had the (6×6) structure as deduced by LEED and STM. To prepare an InGaAs surface, 1-2 monolayers (ML) of indium were deposited on the clean GaAs(100)(6×6) substrate surface and the sample was heated to 500-550° C. This produced the InGaAs(100)c(8×2) surface. This clean well-defined InGaAs(100)c(8×2) surface was oxidized, resulting in the c(4×2)-O layer similar to the InAs(100)c(4×2)-O case, as follows: First the substrate temperature was increased to about 550° C. in 15 min in vacuum conditions. Then the leak valve of the oxygen ($O_2$) gas line, connected to the vacuum chamber, was opened and the oxygen pressure was increased to 3-4×$10^{-6}$ mbar. After the 15 min oxidation at the oxygen pressure of 3-4×$10^{-6}$ mbar and 550° C. (InGaAs), the heating was closed 10 s before closing the oxygen flow. The c(4×2) crystal structure was determined by LEED. The formation of the c(4×2)-O layer in the InGaAs surface clearly indicates that the (3×1)-O layer forms also in InGaAs, like in the InAs case, if the amount of Indium (In) is increased in the InGaAs surface layer.

On the basis of the preparation conditions of InAs(100)c (4×2)-O and -(3×1)-O, in which the (3×1)-O is always formed at a lower temperature than c(4×2)-O, it can be concluded that the (3×1)-O forms on InGaAs at temperatures lower than 550° C.

The oxidation of the InP substrate has been carried out as is described in the following examples.

The surface of the InP(100) substrate wafer (about 0.5 mm thick) was cleaned from the carbon contamination and amorphous surface oxides with Ar-ion sputtering and heating in ultrahigh vacuum (UHV) chamber. During the 30 minutes raster sputtering, the Ar-gas pressure was $1-3 \times 10^{-6}$ mbar, the sputtering voltage was 0.7 kV and the current 10 mA, and the InP substrate temperature was about 370° C. After the sputtering, the InP substrate was heated to about 470° C. in a vacuum smaller than $1 \times 10^{-9}$ mbar for 30 min. Three such sputtering-postheating cycles produced clean and smooth surface, which had the mixed-dimer (2×4) structure as deduced by LEED and STM. This clean well-defined InP (100)(2×4) surface was oxidized, resulting in the (2×3)-O layer, as follows: first the InP substrate temperature was increased to about 480° C. in 15 min in vacuum conditions. Then the leak valve of the oxygen ($O_2$) gas line, connected to the vacuum chamber, was opened and the oxygen pressure was increased to $3-4 \times 10^{-6}$ mbar. After the 15 min oxidation at the oxygen pressure of $3-4 \times 10^{-6}$ mbar and the temperature of about 480° C. (InP), the heating was closed 10 s before closing the oxygen flow.

The same (2×3)-O layer was also obtained by the 15 min oxidation at the oxygen pressure of $7-8 \times 10^{-7}$ mbar and the temperature of about 460° C. (InP). The (2×3) crystal structure was determined by LEED and STM. X-ray photoelectron spectroscopy (XPS) revealed three peaks for the O1s emission at 528, 531, and 537 eV binding energies. Also the P 2p emission shows two oxygen-related peaks at 133 and 138 eV.

Table 3 presents other examples of the oxidation of InP substrate. The oxidation of the clean InP(100)(2×4) surface was carried out at about 450° C. by changing the oxidation time (the resistive heating voltage and current were 13.0 V and 2.3 A in all the tests I-V). The oxygen pressure was between $5 \times 10^{-7}$ and $5 \times 10^{-5}$ mbar in all cases. The results in Table 3 indicate that 450° C. is a too low temperature for obtaining pure (2×3)-O. The presence of (2×4) in all the cases indicates the presence of some clean InP(100)(2×4) areas on the surfaces.

TABLE 3

| Oxidation | T (° C.) | t (min) | LEED |
|---|---|---|---|
| I | 453 | 5 | weaker (2×4) than the clean surface (2×4) |
| II | 452 | 10 | weak (2×4) + weak (2×3)-O |
| III | 455 | 15 | (2×3)-O + weak (2×4) |
| IV | 450 | 20 | (2×3)-O + weak (2×4) |
| V | 453 | 30 | (2×3)-O + weak (2×4) |

The oxidation of Sn-covered surfaces was performed as follows. After cleaning the InAs substrate surface, as described above, 0.5-2.0 ML of tin was deposited onto the cleaned InAs(100)c(8×2) substrate surface at room temperature. This Sn-covered surface was then heated in vacuum at 350-420° C. for 15-30 min, which provided the Sn-induced (1×2) reconstruction, as deduced by LEED and STM. After that the sample was transferred in the oxidation chamber, and its temperature was risen up to 420° C. Then the oxygen ($O_2$) gas was introduced into the chamber via the leak valve. The oxidation in $3-4 \times 10^{-6}$ mbar for 10 min produced the InAs (100)(3×3)-SnO surface layer. Decreasing the substrate temperature during the oxidation and/or increasing the oxygen exposure produced the InAs(100)(3×1)-SnO.

Figure 6:
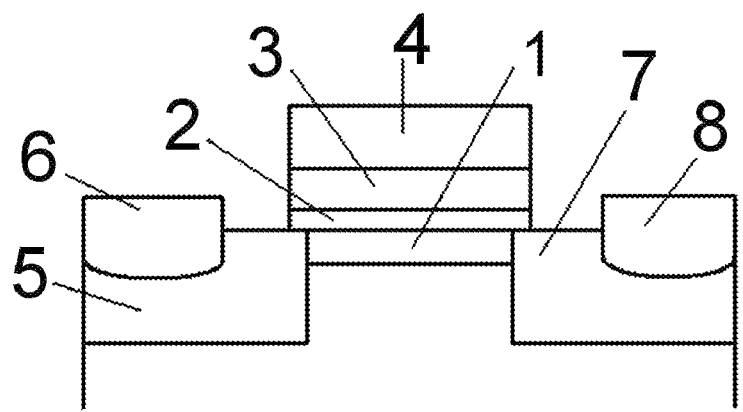
FIG. 6 shows a simplified cross-sectional view of a structure in semiconductor device.

The electronic structure of an insulator-semiconductor interface has a significant role in the MOSFET transistor applications. The substrate according to the invention, comprising In-containing III-As, III-Sb or III-P base material and a crystalline oxide layer such as (3×1)-O being formed on the In-containing III-As or III-Sb base material or (2×3)-O being formed on the In-containing III-P base material, can be used in the insulator-semiconductor interface in the MOSFET transistors. The example of structure of the MOSFET transistor comprising a compound semiconductor substrate according to the invention is presented in FIG. 6. It comprises the In-containing III-As, III-Sb or III-P channel layer 1 such as InAs, InGaAs, InSb, InGaSb or III-P, and the crystalline oxide layer 2 formed on the surface of the channel layer. The second insulator layer 3, which can be for example $SiO_2$ or $Al_2O_3$, is formed on the surface of the oxide layer. The structure also comprises a gate metal 4, a source contact layer 5, a source metal 6 which can be for example AuGeNi, a drain contact layer 7 and a drain metal 8 like AuGeNi. The crystalline oxide layer according to the invention serves as a barrier layer for electrons and holes in the In-containing channel so that the electric carriers do not leak toward the gate oxide. The crystalline oxide layer acts as an important part of the gate insulator stack.

The invention is not restricted to the examples of the above description, but it can be modified within the scope of the inventive idea presented in the claims.

REFERENCES

[1] H. Ko, K. Takei, R. Kapadia, S. Chuang, H. Fang, P. W. Leu, K. Ganapathi, E. Plis, H. S. Kim, S. Y. Chen, M. Madsen, A. C. Ford, Y. L. Chueh, S. Krishna, S. Salahuddin, and A. Javey A: Ultrathin compound semiconductor on insulator layers for high-performance nanoscale transistors. *Nature* Vol. 468: p. 286 (2010).
[2] G. Chen, S. B. Visbeck, D. C. Law, and R. F. Hicks: Structure-sensitive oxidation of the indium phosphide (001) surface. *Journal of Applied Physics* Vol. 91: p. 9362 (2002).

The invention claimed is:

1. A compound semiconductor substrate, wherein the substrate comprises at least
   an In-containing III-As, III-Sb or III-P base material having a first side and a second side, and
   a crystalline (3×1)-O, c(4×2)-O, (1×2)-O, (2×3)-O, (3×1)-SnO, (3×3)-SnO, or (1×1)-SnO oxide layer being formed on at least a part of the first side of the base material.

2. The substrate according to claim 1, wherein the oxide layer has been formed by a method for producing a crystalline oxide layer on an In-containing III-As, III-Sb or III-P compound semiconductor substrate, comprising in vacuum conditions
   a surface of an In-containing III-As, III-Sb or III-P substrate which is clean from amorphous native oxides is provided, the clean substrate is heated to a temperature of about 250-550° C. and, while kept at said temperature, oxidized by introducing oxygen gas onto the surface of the substrate.

3. The substrate according to claim 1, wherein the oxide layer has a c(4×2)-O crystal structure, when the In-containing III-As base material is InAs or InGaAs.

4. The substrate according to claim 1, wherein the oxide layer has a (1×1)-SnO crystal structure, when the In-containing III-P base material is InP or InGaP.

5. The substrate according to claim 1, wherein the base material is a layer, which has been applied on the surface of a Si substrate.

6. The substrate according to claim 1, wherein the thickness of the oxide layer is typically 0.2-1 nm.

7. The substrate according to claim 1 in a structure of a transistor.

8. The substrate according to claim 1 in a structure of an optoelectronic device.

9. A compound semiconductor substrate, wherein the substrate comprises at least
 an In-containing III-As, III-Sb or III-P base material having a first side and a second side, and
 a crystalline (3×1)-O, c(4×2)-O, (1×2)-O, (2×3)-O, (3×1)-SnO, (3×3)-SnO, or (1×1)-SnO oxide layer being formed on at least a part of the first side of the base material,
 wherein the oxide layer has a (3×1)-O crystal structure, when the In-containing III-As or III-Sb base material is InAs, InSb, InGaAs or InGaSb.

10. A compound semiconductor substrate, wherein the substrate comprises at least
 an In-containing III-As, III-Sb or III-P base material having a first side and a second side, and
 a crystalline (3×1)-O, c(4×2)-O, (1×2)-O, (2×3)-O, (3×1)-SnO, (3×3)-SnO, or (1×1)-SnO oxide layer being formed on at least a part of the first side of the base material,
 wherein the oxide layer has a (1×2)-O crystal structure, when the In-containing III-Sb base material is InSb or InGaSb.

11. A compound semiconductor substrate, wherein the substrate comprises at least
 an In-containing III-As, III-Sb or III-P base material having a first side and a second side, and
 a crystalline (3×1)-O, c(4×2)-O, (1×2)-O, (2×3)-O, (3×1)-SnO, (3×3)-SnO, or (1×1)-SnO oxide layer being formed on at least a part of the first side of the base material,
 wherein the base material is InP and the oxide layer has a (2×3)-O crystal structure.

12. A compound semiconductor substrate, wherein the substrate comprises at least
 an In-containing III-As, III-Sb or III-P base material having a first side and a second side, and
 a crystalline (3×1)-O, c(4×2)-O, (1×2)-O, (2×3)-O, (3×1)-SnO, (3×3)-SnO, or (1×1)-SnO oxide layer being formed on at least a part of the first side of the base material,
 wherein the oxide layer has a (3×1)-SnO or (3×3)-SnO crystal structure, when the In-containing III-As base material is InAs, or InGaAs.

* * * * *